United States Patent
Liu et al.

(10) Patent No.: US 12,425,007 B2
(45) Date of Patent: Sep. 23, 2025

(54) RAMP SIGNAL CALIBRATION DEVICE

(71) Applicant: REALTEK SEMICONDUCTOR CORPORATION, Hsinchu (TW)

(72) Inventors: Yen-Wei Liu, Hsinchu (TW);
Tsung-Yen Tsai, Hsinchu (TW);
Wen-Hau Yang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 401 days.

(21) Appl. No.: 17/731,272

(22) Filed: Apr. 28, 2022

(65) Prior Publication Data
US 2022/0360256 A1    Nov. 10, 2022

(30) Foreign Application Priority Data
May 4, 2021    (TW) .................................. 110116049

(51) Int. Cl.
*H03K 4/06*    (2006.01)
*H03M 1/10*    (2006.01)

(52) U.S. Cl.
CPC ............ *H03K 4/06* (2013.01); *H03M 1/1009* (2013.01)

(58) Field of Classification Search
CPC ............................... H03K 4/06; H03M 1/1009
See application file for complete search history.

(56) References Cited

U.S. PATENT DOCUMENTS

| | | | | |
|---|---|---|---|---|
| 4,581,585 A | * | 4/1986 | Bristol ..................... | H03K 4/08 327/134 |
| 4,916,677 A | * | 4/1990 | Fox ........................ | G01R 23/02 968/853 |
| 7,595,624 B2 | * | 9/2009 | Tateishi ................. | H02M 3/158 323/288 |
| 10,003,328 B1 | * | 6/2018 | Yin .......................... | H03K 7/08 |
| 10,418,978 B1 | * | 9/2019 | Au Yeung ............ | H03K 5/1565 |

(Continued)

FOREIGN PATENT DOCUMENTS

WO    WO-9324996 A1 * 12/1993    ........... H03K 3/0231

OTHER PUBLICATIONS

OA letter of a counterpart TW application (appl. No. 110116049) mailed on Sep. 27, 2021. Summary of the OA letter: 1. Claims 1, 8, and 10 are rejected as allegedly being anticipated by cited reference 1 (U.S. Appl. No. 10/418,978 B1). 2. Claims 2-7 and 9 are allowable. Correspondence between claims of TW counterpart application and claims of US application: 1. Claims 1-7, 8-9 and 10 in TW counterpart application correspond to claims 1-7, 10, 12, and 17 in US application, respectively.

*Primary Examiner* — Lisa M Caputo
*Assistant Examiner* — Nyla Gavia
(74) *Attorney, Agent, or Firm* — WPAT, PC (57) ABSTRACT

A ramp signal calibration device includes a ramp generator circuit, a detector circuitry, and a calibration circuit. The ramp generator circuit is configured to output a ramp signal according to a set signal and a calibration signal. The detector circuitry is configured to detect the ramp signal or at least one pulse signal associated with the ramp signal, in order to generate at least one control signal. The calibration circuit is configured to generate the calibration signal in response to the at least one control signal, in order to adjust at least one of a falling slope or a rising slope of the ramp signal, or to adjust a duty cycle of the at least one pulse signal.

12 Claims, 6 Drawing Sheets

(56) References Cited

U.S. PATENT DOCUMENTS

| | | | |
|---|---|---|---|
| 2005/0280565 A1* | 12/2005 | Kushner | H03M 1/1061 |
| | | | 341/120 |
| 2009/0066826 A1* | 3/2009 | Gelfand | H04N 25/78 |
| | | | 348/308 |
| 2010/0134083 A1* | 6/2010 | Trescases | H03M 1/1014 |
| | | | 323/283 |
| 2012/0081936 A1* | 4/2012 | Walters | H02M 7/217 |
| | | | 363/80 |
| 2014/0036124 A1* | 2/2014 | Higuchi | H04N 25/677 |
| | | | 341/169 |
| 2015/0350585 A1* | 12/2015 | Kim | H04N 25/78 |
| | | | 348/308 |

\* cited by examiner

RAMP SIGNAL CALIBRATION DEVICE

BACKGROUND OF THE INVENTION

1. Field of the Invention

The present disclosure relates to a ramp signal calibration device, especially to a ramp signal calibration device that calibrates ramp signals having dual edges.

2. Description of Related Art

A ramp (or referred to as "triangle wave") signal is commonly utilized in analog circuit(s) to define a duty cycle or provide phase information. In practical applications, owing to process variation and memory effect, the ramp signal may be inaccurate, which results in inaccurate duty cycle or inaccurate phase information. In some approaches, in order to eliminate errors in the ramp signal, additional time is required to periodically reset the ramp signal to a predetermined level. As a result, a usable period of the ramp signal will be shortened, which results in lower availability of ramp signal.

SUMMARY OF THE INVENTION

In some aspects of the present disclosure, a ramp signal calibration device includes a ramp generator circuit, a detector circuitry, and a calibration circuit. The ramp generator circuit is configured to output a ramp signal according to a set signal and a calibration signal. The detector circuitry is configured to detect the ramp signal or at least one pulse signal associated with the ramp signal, in order to generate at least one control signal. The calibration circuit is configured to generate the calibration signal in response to the at least one control signal, in order to adjust at least one of a falling slope or a rising slope of the ramp signal, or to adjust a duty cycle of the at least one pulse signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
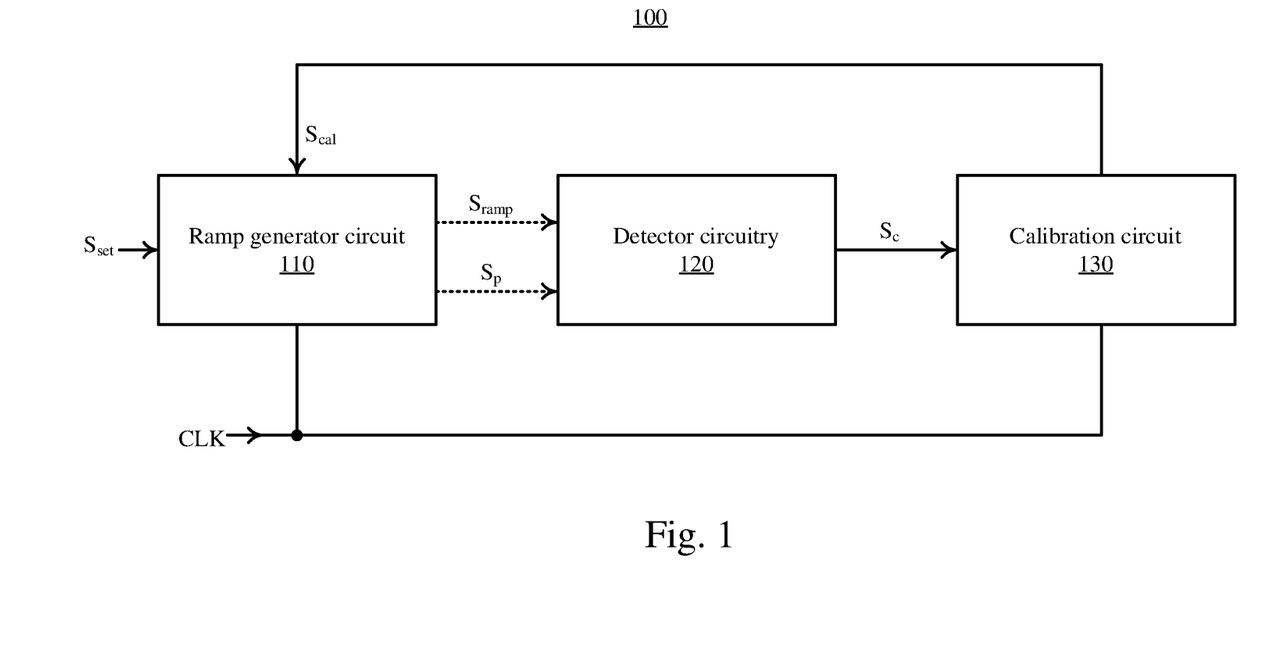
FIG. 1 is a schematic diagram of a ramp signal calibration device according to some embodiments of the present disclosure.

FIG. 1 is a schematic diagram of a ramp signal calibration device 100 according to some embodiments of the present disclosure. In some embodiments, the ramp signal calibration device 100 may be applied to, but not limited to, a switching regulator.

The ramp signal calibration device 100 includes a ramp generator circuit 110, a detector circuitry 120, and a calibration circuit 130. The ramp generator circuit 110 is configured to output a ramp signal $S_{ramp}$ according to a set signal $S_{set}$ and a calibration signal $S_{cal}$. For example, the set signal $S_{set}$ may be a digital signal having multiple bits, and the ramp generator circuit 110 may generate the ramp signal $S_{ramp}$ having a corresponding slope according to this digital signal. The calibration signal $S_{cal}$ may be configured to adjust the ramp signal $S_{ramp}$, in order reduce an error of the ramp signal $S_{ramp}$.

Figure 2A:
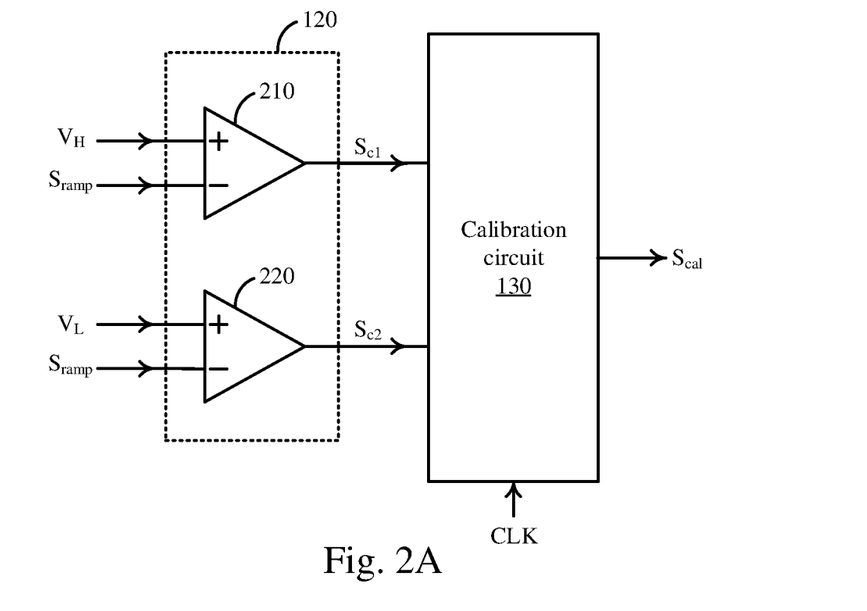
FIG. 2A is a schematic diagram of the detector circuitry in FIG. 1 according to some embodiments of the present disclosure.
Figure 3A:
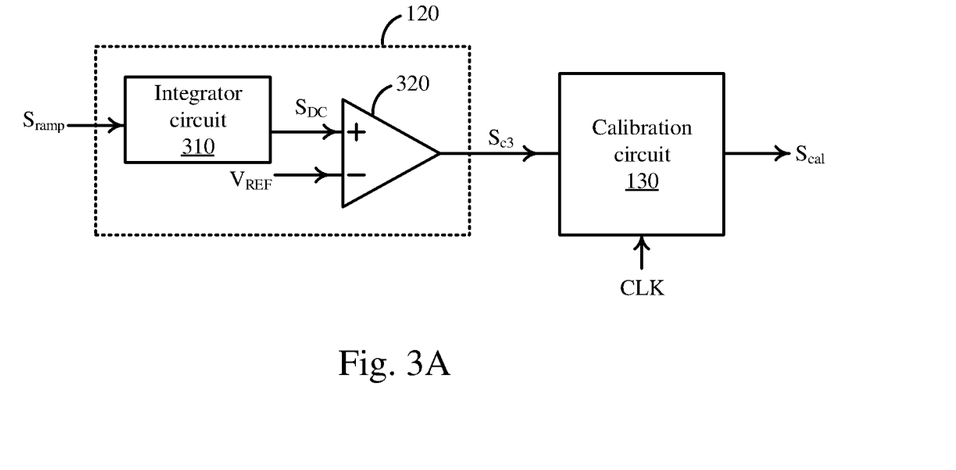
FIG. 3A is a schematic diagram of the detector circuitry in FIG. 1 according to some embodiments of the present disclosure.
Figure 4A:
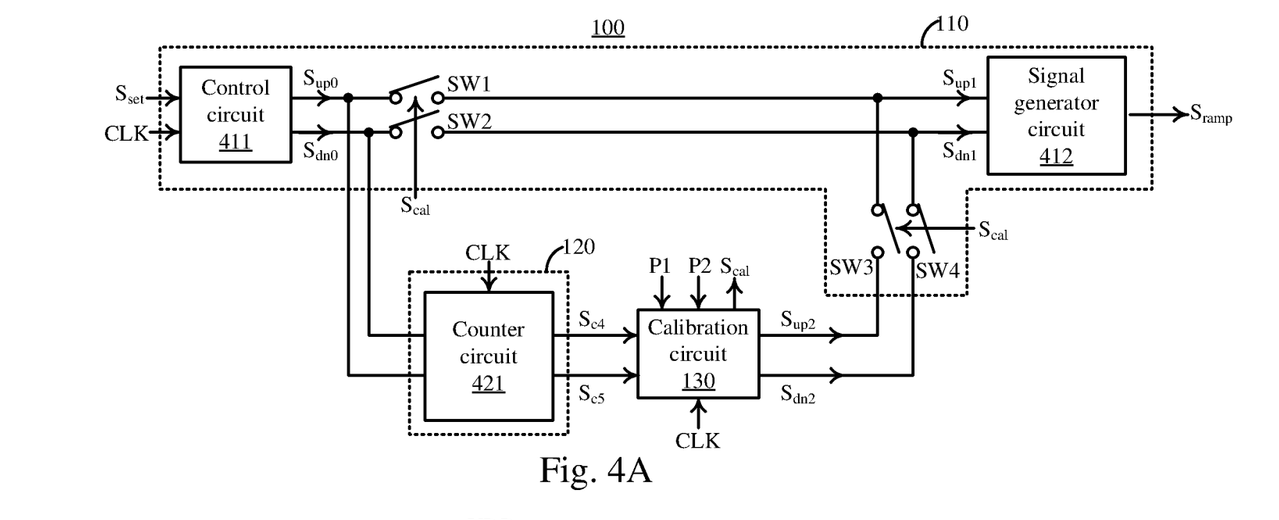
FIG. 4A is a circuit diagram of the ramp signal calibration device in FIG. 1 according to some embodiments of the present disclosure.

In some embodiments, the detector circuitry 120 is configured to detect the ramp signal $S_{ramp}$ (as shown in FIG. 2A or FIG. 3A) or detect at least one pulse signal $S_p$ (e.g., at least one of a charging signal $S_{up1}$ or a discharging signal $S_{dn1}$ in FIG. 4A) associated with the ramp signal $S_{ramp}$, in order to generate at least one control signal $S_c$ (e.g., control signals $S_{c1}$ and $S_{c2}$ in FIG. 2A, a control signal $S_{c3}$ in FIG. 3A, or control signals $S_{c4}$ and $S_{c5}$ in FIG. 4A). In some embodiments, the at least one pulse signal $S_p$ is configured to generate the ramp signal $S_{ramp}$. The calibration circuit 130 is configured to generate the calibration signal $S_{cal}$ in response to the at least one control signal $S_c$, in order to adjust at least one of a falling slope (or a negative slope) or a rising slope (or a positive slope) of the ramp signal $S_{ramp}$ or a duty cycle of the at least one pulse signal $S_p$. In some embodiments, the calibration circuit 130 may be a digital signal processor circuit, which may perform operations discussed in the following embodiments. In some embodiments, each of the ramp generator circuit 110 and the calibration circuit 130 includes at least one digital circuit, and the clock signal CLK may be configured to provided required timings for operation of the at least one digital circuit.

In some related approaches, a ramp (or a triangle wave) signal is commonly utilized by an analog circuit to generate a duty cycle or to provide phase information. Due to process variation and the memory effect, error(s) may occur in the ramp signal. In order to reduce such error, in these approaches, an additional time is required to reset the ramp signal (i.e., re-calibrate the level of the ramp signal to a predetermined level). As a result, the availability of the ramp signal is reduced. Compared with the above approaches, in some embodiments of the present disclosure, the calibration circuit 130 may adjust the ramp signal $S_{ramp}$ without resetting the ramp signal $S_{ramp}$ to reduce the error of the ramp signal $S_{ramp}$ As a result, the reduction of the availability of the ramp signal $S_{ramp}$ can be avoided.

FIG. 2A is a schematic diagram of the detector circuitry 120 in FIG. 1 according to some embodiments of the present disclosure. In this example, the detector circuitry 120 includes a comparator circuit 210 and a comparator circuit 220. The comparator circuit 210 is configured to compare the ramp signal $S_{ramp}$ with a reference voltage $V_H$ in response to a corresponding one of a falling edge and a rising edge of the ramp signal $S_{ramp}$, in order to generate the control signal $S_{c1}$. If the ramp signal $S_{ramp}$ is lower than the reference voltage $V_H$, the comparator circuit 210 generates the control signal $S_{c1}$ having a first logic value (e.g., a logic value of 1). Alternatively, if the ramp signal $S_{ramp}$ is higher than or equal to the reference voltage $V_H$, the comparator circuit 210 generates the control signal $S_{c1}$ having a second logic value (e.g., a logic value of 0). Similarly, the comparator circuit 220 is configured to compare the ramp signal $S_{ramp}$ with a reference voltage $V_L$ in response to the corresponding one of the falling edge and the rising edge of the ramp signal $S_{ramp}$, in order to generate the control signal $S_{c2}$. If the ramp signal $S_{ramp}$ is lower than the reference voltage $V_L$, the comparator circuit 220 generates the control signal $S_{c2}$ having the first logic value. Alternatively, if the ramp signal $S_{ramp}$ is higher than or equal to the reference voltage $V_L$, the comparator circuit 220 generates the control signal $S_{c2}$ the second logic value. In some embodiments, the reference voltage $V_H$ is higher than the reference voltage $V_L$.

Figure 2B:
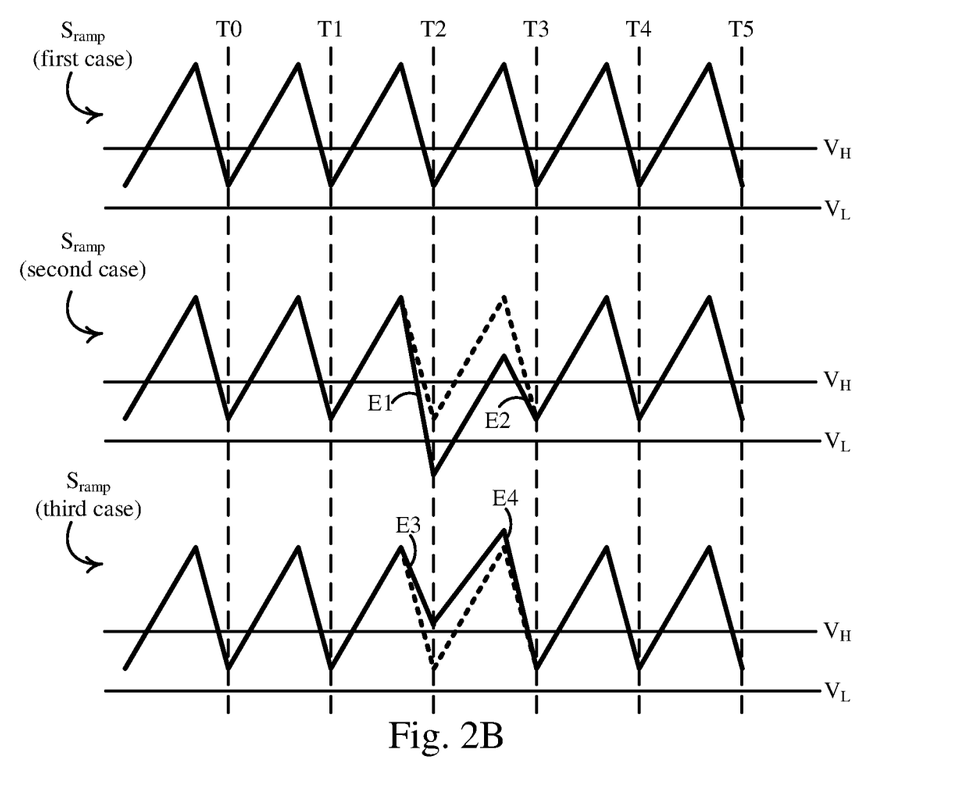
FIG. 2B is a waveform diagram of relevant signals in FIG. 2A according to some embodiments of the present disclosure.

FIG. 2B is a waveform diagram of relevant signals in FIG. 2A according to some embodiments of the present disclosure. In FIG. 2B, waveforms illustrated with dotted lines are ideal waveforms for comparison. In this example, the comparator circuit 210 and the comparator circuit 220 detect the ramp signal $S_{ramp}$ at time T0, time T1, time T2, time T3, time T4, and time T5 in response to falling edges of the ramp signal $S_{ramp}$. The calibration circuit 130 may output the calibration signal $S_{cal}$, in order to adjust the falling slope of the ramp signal $S_{ramp}$.

In a first case, at times T0-T5, the ramp signal $S_{ramp}$ is lower than the reference voltage $V_H$ and higher than the reference voltage $V_L$. Under this condition, it indicates that the ramp signal $S_{ramp}$ is stably within a predetermined range. The comparator circuit 210 outputs the control signal $S_{c1}$ having the logic value of 1, and the comparator circuit 220 outputs the control signal $S_{c2}$ having the logic value of 0. In response to the control signal $S_{c1}$ and the control signal $S_{c2}$, the calibration circuit 130 does not adjust the signal value of the calibration signal $S_{cal}$, in order not to adjust the ramp signal $S_{ramp}$.

In a second case, in response to the falling edge E1, the comparator circuit 210 detects that the ramp signal $S_{ramp}$ is lower than the reference voltage $V_H$, and the comparator circuit 220 detects that the ramp signal $S_{ramp}$ is lower than the reference voltage $V_L$. Under this condition, it indicates that the error on the ramp signal $S_{ramp}$ is too large, such that the ramp signal $S_{ramp}$ is lower than the reference voltage $V_L$. The comparator circuit 210 outputs the control signal $S_{c1}$ having the logic value of 1, and the comparator circuit 220 outputs the control signal $S_{c2}$ having the logic value of 1. In response to the control signal $S_{c1}$ and the control signal $S_{c2}$, the calibration circuit 130 outputs the corresponding calibration signal $S_{cal}$. The ramp generator circuit 110 decreases an absolute value of the slope of a next falling edge E2 of the ramp signal $S_{ramp}$ according to the calibration signal $S_{cal}$, to restore the ramp signal $S_{ramp}$ can be restored to the predetermined range.

For example, a slope of the falling edge E1 is m1, and a slope of the falling edge E2 is m2, in which m1 and m2 are negative values. For example, m1 is −2 and m2 is −1. In order to restore the ramp signal $S_{ramp}$ to the predetermined range, the calibration circuit 130 may output the corresponding calibration signal $S_{cal}$ to decrease a voltage drop of the ramp signal $S_{ramp}$ in a next cycle. The ramp generator circuit 110 can increase the negative slope of a next falling edge E2 of the ramp signal $S_{ramp}$ (i.e., reducing the absolute value of that slope) according to the calibration signal $S_{cal}$. As a result, the ramp signal $S_{ramp}$ is able to be restored in the predetermined range in the next cycle.

In a third case, in response to a falling edge E3, the comparator circuit 210 detects that the ramp signal $S_{ramp}$ is higher than the reference voltage $V_H$, and the comparator circuit 220 detects that the ramp signal $S_{ramp}$ higher than the reference voltage $V_L$. Under this condition, it indicates that the error is too large, such that the ramp signal $S_{ramp}$ is higher than the reference voltage $V_H$. The comparator circuit 210 outputs the control signal $S_{c1}$ having the logic value of 0, and the comparator circuit 220 outputs the control signal $S_{c2}$ having the logic value of 0. In response to the control signal $S_{c1}$ and the control signal $S_{c2}$, the calibration circuit 130 outputs the corresponding calibration signal $S_{cal}$. The ramp generator circuit 110 further increases an absolute value of a next falling edge E4 of the ramp signal $S_{ramp}$ according to the calibration signal $S_{cal}$, in order to restore the ramp signal $S_{ramp}$ to the predetermined range.

For example, the falling edge E3 has a slope m3, and the falling edge E4 has a slope m4, in which m3 and m4 are negative values. For example, m3 is −1, and m4 is −2. In order to restore the ramp signal $S_{ramp}$ to the predetermined range, the calibration circuit 130 outputs the corresponding calibration signal $S_{cal}$ to increase the amount of the voltage drop of the ramp signal $S_{ramp}$ in the next cycle. The ramp generator circuit 110 may decrease the negative slope of a next falling edge E4 of the ramp signal $S_{ramp}$ according to the calibration signal $S_{cal}$ (i.e., increase the absolute value of this slope). As a result, the ramp signal $S_{ramp}$ can be restored to the predetermined range in the next cycle.

Figure 2C:
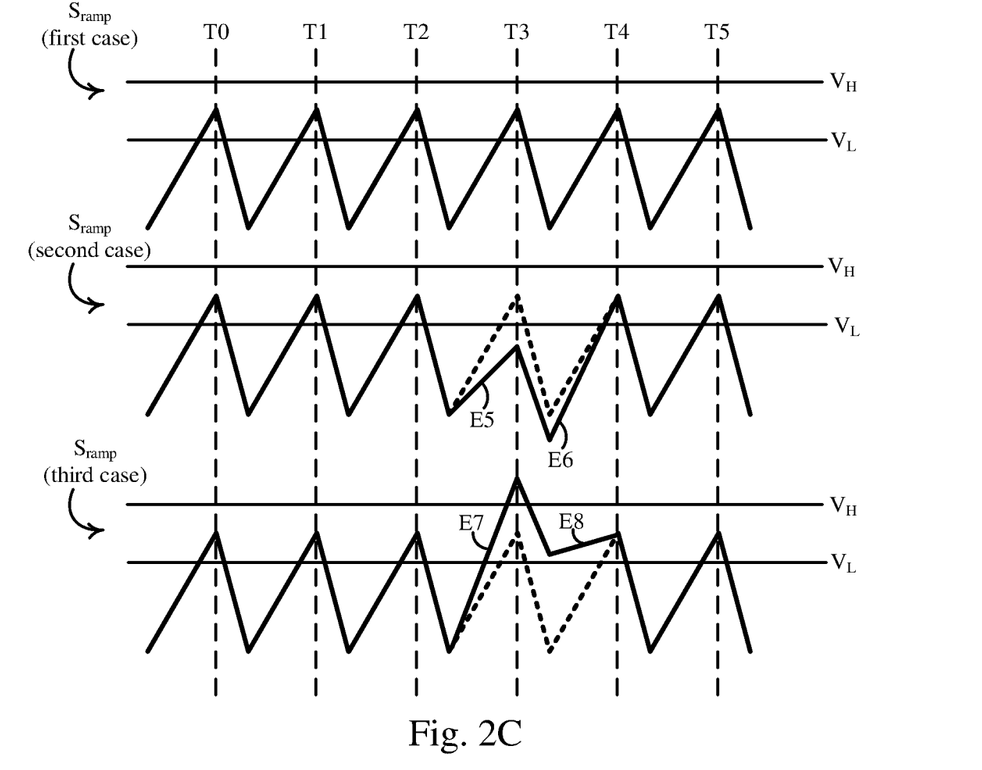
FIG. 2C is a waveform diagram of relevant signals in FIG. 2A according to some embodiments of the present disclosure.

FIG. 2C is a waveform diagram of relevant signals in FIG. 2A according to some embodiments of the present disclosure. In FIG. 2C, signals illustrated with dotted lines are ideal waveforms for comparison. In this example, the comparator circuit 210 and the comparator circuit 220 detect the ramp signal $S_{ramp}$ at time T0, time T1, time T2, time T3, time T4, and time T5 in response to rising edges of the ramp signal $S_{ramp}$. The calibration circuit 130 may output the corresponding calibration signal $S_{cal}$ to adjust the rising slope of the ramp signal $S_{ramp}$. It should be understood that, the reference voltage $V_H$ in FIG. 2C is higher than the reference voltage $V_H$ in FIG. 2B, and the reference voltage $V_L$ in FIG. 2C is higher than the reference voltage $V_L$ in FIG. 2B.

In a first case, similar to FIG. 2B, the ramp signal $S_{ramp}$ is stably within the predetermined range. The comparator circuit 210 outputs the control signal $S_{c1}$ having the logic value of 1, and the comparator circuit 220 outputs the control signal $S_{c2}$ having the logic value of 0. In response to the control signal $S_{c1}$ and the control signal $S_{c2}$, the calibration circuit 130 does not change the calibration signal $S_{cal}$ in order not to adjust the ramp signal $S_{ramp}$.

In a second case, in response to the rising edge E5, the comparator circuit 210 detects that the ramp signal $S_{ramp}$ is lower than the reference voltage $V_H$, and the comparator circuit 220 detects that the ramp signal $S_{ramp}$ is lower than the reference voltage $V_L$. Under this condition, it indicates that the error is too large, such that the ramp signal $S_{ramp}$ is lower than the reference voltage $V_L$. The comparator circuit 210 outputs the control signal $S_{c1}$ having the logic value of 1, and the comparator circuit 220 outputs the control signal $S_{c2}$ having the logic value of 1. In response to the control signal $S_{c1}$ and the control signal $S_{c2}$, the calibration circuit 130 outputs the corresponding calibration signal $S_{cal}$. The ramp generator circuit 110 further increases a slope of a next rising edge E6 of the ramp signal $S_{ramp}$ according to the calibration signal $S_{cal}$, in order to restore the ramp signal $S_{ramp}$ to the predetermined range.

For example, the rising edge E5 has a slope m5, and the rising edge E6 has a slope m6, in which m5 and m6 are positive values. For example, m5 is 1 and m6 is 2. In order to restore the ramp signal $S_{ramp}$ to the predetermined range, the calibration circuit 130 may output the corresponding calibration signal $S_{cal}$ to increase an increment of the ramp signal $S_{ramp}$ at a next cycle. The ramp generator circuit 110 increases a positive slope of a next rising edge E6 of the ramp signal $S_{ramp}$ according to the calibration signal $S_{cal}$. As a result, the ramp signal $S_{ramp}$ can be restored to the predetermined range in the next cycle.

In a third case, in response to a rising edge E7, the comparator circuit 210 detects that the ramp signal $S_{ramp}$ is higher than the reference voltage $V_H$, and the comparator circuit 220 detects that the ramp signal $S_{ramp}$ is higher than the reference voltage $V_L$. Under this condition, it indicates the error is too large, such that the ramp signal $S_{ramp}$ is higher than the reference voltage $V_H$. The comparator circuit 210 outputs the control signal $S_{c1}$ having the logic value of 0, and the comparator circuit 220 outputs the control signal $S_{c2}$ having the logic value of 0. In response to the control signal $S_{c1}$ and the control signal $S_{c2}$, the calibration circuit 130 outputs the corresponding calibration signal $S_{cal}$. The ramp generator circuit 110 further decreases a slope of a next rising edge E8 of the ramp signal $S_{ramp}$ according to the calibration signal $S_{cal}$, in order to restore the ramp signal $S_{ramp}$ to the predetermined range. For example, the rising edge E7 has a slope m7, and the rising edge E8 has a slope m8, in which m7 and m8 are all positive values. For example, m7 is 2, and m8 is 1. In order to restore the ramp signal $S_{ramp}$ to the predetermined range, the calibration circuit 130 outputs the corresponding calibration signal $S_{cal}$ to decrease the increment amount of the ramp signal $S_{ramp}$ in the next cycle. The ramp generator circuit 110 decreases the positive slope of the next rising edge E8 of the ramp signal $S_{ramp}$ according to the calibration signal $S_{cal}$. As a result, the ramp signal $S_{ramp}$ can be restored to the predetermined range in the next cycle.

Figure 2D:
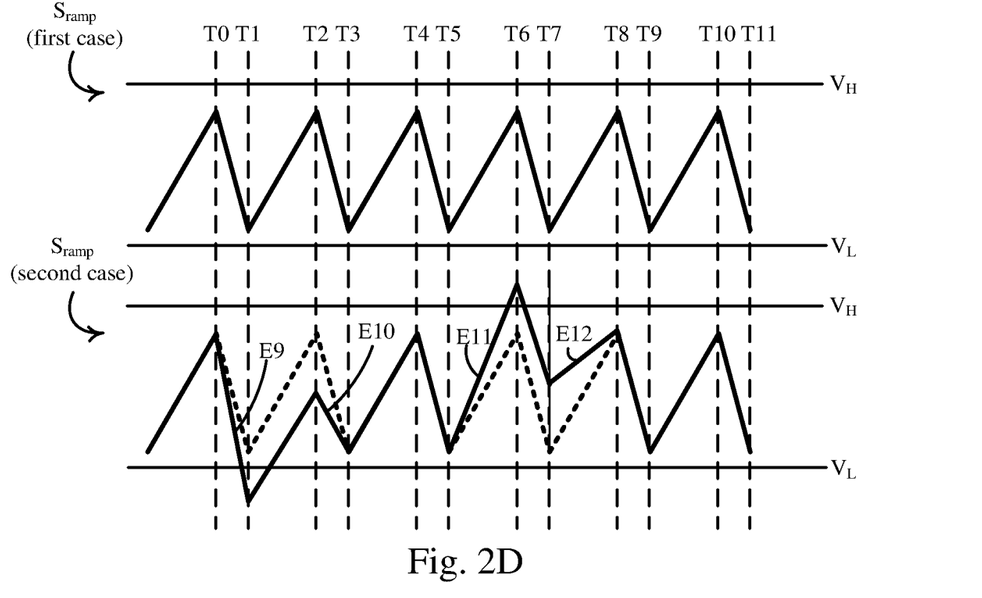
FIG. 2D is a waveform diagram of relevant signals in FIG. 2A according to some embodiments of the present disclosure.

FIG. 2D is a waveform diagram of relevant signals in FIG. 2A according to some embodiments of the present disclosure. In FIG. 2D, signals shown with dotted lines are ideal waveforms for comparison. Different from the above examples, the detector circuitry 120 detects the ramp signal $S_{ramp}$ in response to rising edge(s) and falling edge(s) of the ramp signal $S_{ramp}$. For example, the comparator circuit 210 detects the ramp signal $S_{ramp}$ at time T0, time T2, time T4, time T6, time T8, and time T10 in response to rising edges of the ramp signal $S_{ramp}$, and the comparator circuit 220 detects the ramp signal $S_{ramp}$ at time T1, time T3, time T5, time T7, time T9, and time T11 according to falling edges of the ramp signal $S_{ramp}$. The calibration circuit 130 outputs the corresponding calibration signal $S_{cal}$ to adjust the rising slope and the falling slope of the ramp signal $S_{ramp}$. It should be understood that the reference voltage $V_H$ in FIG. 2D may be higher than the reference voltage $V_H$ in FIG. 2B, and the reference voltage $V_L$ in FIG. 2D may be lower than the reference voltage $V_L$ in FIG. 2C.

In a first case, similar to FIG. 2B, the ramp signal $S_{ramp}$ is stably kept being in the predetermined range. The comparator circuit 210 outputs the control signal $S_{c1}$ having the logic value of 1, and the comparator circuit 220 outputs the control signal $S_{c2}$ having the logic value of 0. In response to the control signal $S_{c1}$ and the control signal $S_{c2}$, the calibration circuit 130 does not change the calibration signal $S_{cal}$, in order not to adjust the ramp signal $S_{ramp}$.

In second case, in response to the falling edge E9, the comparator circuit 220 detects that the ramp signal $S_{ramp}$ is lower than the reference voltage $V_L$. Under this condition, it indicates that the error is too large, such that the ramp signal $S_{ramp}$ is lower than the reference voltage $V_L$. The comparator circuit 220 outputs the control signal $S_{c2}$ having the logic value of 1. Similar to the second case in FIG. 2B, in response to the control signal $S_{c2}$, the calibration circuit 130 outputs the corresponding calibration signal $S_{cal}$. The ramp generator circuit 110 further decreases an absolute value of a slope of a next falling edge E10 of the ramp signal $S_{ramp}$ according to the calibration signal $S_{cal}$, in order to restore the ramp signal $S_{ramp}$ to the predetermined range.

Moreover, in response to a rising edge E11, the comparator circuit 210 detects that the ramp signal $S_{ramp}$ is higher than the reference voltage $V_H$. Under this condition, it indicates that the error is too large, such that the ramp signal $S_{ramp}$ is higher than the reference voltage $V_H$. The comparator circuit 210 outputs the control signal $S_{c1}$ having the logic value of 0. Similar to the third case in FIG. 2C, in response to the control signal $S_{c1}$, the calibration circuit 130 outputs the corresponding calibration signal $S_{cal}$. The ramp generator circuit 110 further decreases a slope of a next rising edge E12 of the ramp signal $S_{ramp}$ according to the calibration signal $S_{cal}$ in order to restore the ramp signal $S_{ramp}$ to the predetermined range.

FIG. 3A is a schematic diagram of the detector circuitry 120 in FIG. 1 according to some embodiments of the present disclosure. In this example, the detector circuitry 120 includes an integrator circuit 310 and an error amplifier circuit 320. The integrator circuit 310 is configured to generate a DC (direct current) value $S_{DC}$ associated with the ramp signal $S_{ramp}$ according to the ramp signal $S_{ramp}$. For example, the integrator circuit 310 may perform a low-pass filtering operation on the ramp signal $S_{ramp}$, in order to generate the DC value $S_{DC}$. The error amplifier circuit 320 generates a control signal $S_{c3}$ according to the DC value $S_{DC}$ and a reference voltage $V_{REF}$. The calibration circuit 130 may generates the corresponding calibration signal $S_{cal}$ according to the control signal $S_{c3}$.

Figure 3B:
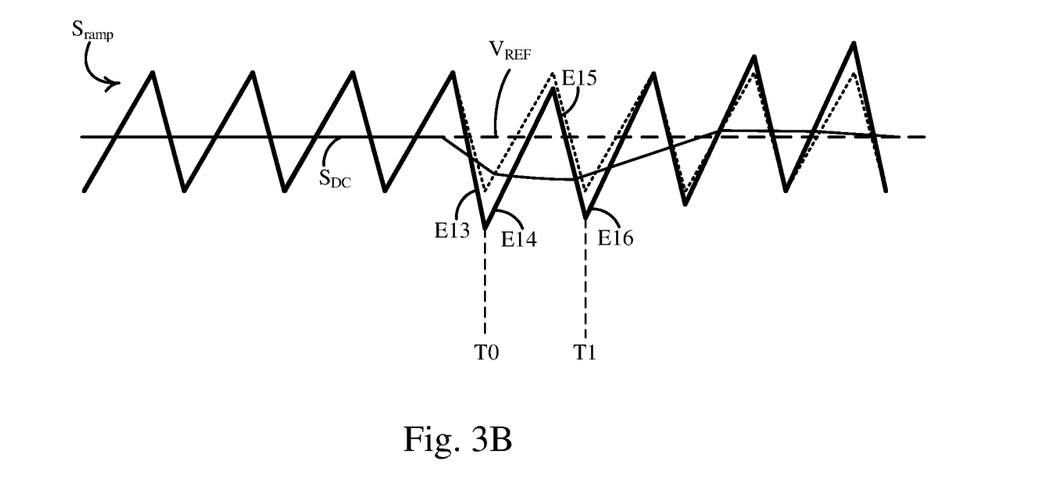
FIG. 3B is a waveform diagram of relevant signals in FIG. 3A according to some embodiments of the present disclosure.

FIG. 3B is a waveform diagram of relevant signals in FIG. 3A according to some embodiments of the present disclosure. As shown in FIG. 3B, during an initial phase, the DC value $S_{DC}$ of the ramp signal $S_{ramp}$ is substantially the same as the reference voltage $V_{REF}$. At time T0, an error in the ramp signal $S_{ramp}$ is too large, such that a level of a falling edge E13 is significantly lower than a predetermined level of an ideal waveform (shown with dotted lines). As a result, the DC value $S_{DC}$ is lower. The error amplifier circuit 320 generates the corresponding control signal $S_{c3}$ according to the DC value $S_{DC}$ and the reference voltage $V_{REF}$. In order to restore the ramp signal $S_{ramp}$ to a normal level, the calibration circuit 130 generates the corresponding calibration signal $S_{cal}$ according to the control signal $S_{c3}$, in order to control the ramp generator circuit 110 to increase the slope of a next rising edge E14 of the ramp signal $S_{ramp}$. At time T1, the level of the falling edge E15 is still lower than the predetermined level of the ideal waveform. As a result, the error amplifier circuit 320 generates the corresponding control signal $S_{c3}$ according to the DC value $S_{DC}$ and the reference voltage $V_{REF}$. In order to restore the ramp signal $S_{ramp}$ to the predetermined level, the calibration circuit 130 generates the corresponding calibration signal $S_{cal}$ according to the control signal $S_{c3}$, in order to control the ramp generator circuit 110 to increase the slope of a next rising edge E16 of the ramp signal $S_{ramp}$. With this analogy, by repeatedly performing the above operations, the DC value $S_{DC}$ of the ramp signal $S_{ramp}$ can be restored to (or close to) the reference voltage $V_{REF}$. As a result, the error in the ramp signal $S_{ramp}$ can be reduced.

FIG. 4A is a circuit diagram of the ramp signal calibration device 100 in FIG. 1 according to some embodiments of the present disclosure. Compared with the above examples, in this example, the calibration circuit 130 can be configured to adjust the duty cycle of the at least one pulse signal $S_p$. The ramp generator circuit 110 includes a control circuit 411, a signal generator circuit 412, and switches SW1-SW4. The control circuit 411 generates a charging signal $S_{up0}$ and a discharging signal $S_{dn0}$ according to a set signal $S_{set}$ and the clock signal CLK. In some embodiments, the control circuit 411 may be a digital logic circuit, which performs a predetermined bit-wise operation or search a lookup table according to the set signal $S_{set}$, in order to generate the charging signal $S_{up1}$ and the discharging signal $S_{dn0}$ according to the clock signal CLK. The signal generator circuit 412 is configured to generate the ramp signal $S_{ramp}$ according to a charging signal $S_{up1}$ and a discharging signal $S_{dn1}$. The switches SW1-SW2 form a first path coupled between the control circuit 411 and the signal generator circuit 412. The switches SW3-SW4 form a second path coupled between the calibration circuit 130 and the signal generator circuit 412.

In this example, the calibration circuit 130 may output the calibration signal $S_{cal}$ to selectively switch the first path and the second path. For example, if the calibration circuit 130 determines not to calibrate the current ramp signal $S_{ramp}$, the calibration circuit 130 outputs the corresponding calibration signal $S_{cal}$ to turn on the switches SW1-SW2 and turn off the switches SW3-SW4. As a result, the control circuit 411 outputs the charging signal $S_{up0}$ and the discharging signal $S_{dn0}$ to be the charging signal $S_{up1}$ and the discharging signal $S_{dn1}$ via the first path, respectively, and transmits those signals to the signal generator circuit 412. As a result, the signal generator circuit 412 may generate the ramp signal $S_{ramp}$ according to the charging signal $S_{up1}$ and the discharging signal $S_{dn1}$.

Alternatively, if the calibration circuit 130 determines to calibrate the current ramp signal $S_{ramp}$, the calibration circuit 130 outputs the corresponding calibration signal $S_{cal}$ to turn off the switches SW1-SW2 and turn on the switches SW3-SW4. As a result, the calibration circuit 130 outputs a charging signal $S_{up2}$ and a discharging signal $S_{dn2}$ to be the charging signal $S_{up1}$ and the discharging signal $S_{dn1}$ via the second path, respectively, and transmit those signals to the signal generator circuit 412. As a result, the signal generator circuit 412 may generate the ramp signal $S_{ramp}$ according to the charging signal $S_{up1}$ and the discharging signal $S_{dn1}$. In other words, when the calibration circuit 130 is going to calibrate the ramp signal $S_{ramp}$, the charging signal $S_{up0}$ can be replaced with the charging signal $S_{up2}$, and the discharging signal $S_{dn0}$ can be replaced with the discharging signal $S_{dn2}$.

The detector circuitry 120 includes a counter circuit 421. The counter circuit 421 is configured to count pulses in the clock signal CLK (as shown in FIG. 4C) according to the charging signal $S_{up0}$ to generate a control signal $S_{c4}$, and is configured to count the pulses in the clock signal CLK according to the discharging signal $S_{dn0}$ to generate a control signal $S_{c5}$. The calibration circuit 130 may compare the control signal $S_{c4}$ with a predetermined value P1, and compare the control signal $S_{c5}$ with a predetermined value P2. In some embodiments, the calibration circuit 130 includes at least one register (not shown), which is configured to store information of the predetermined value P1 and the predetermined value P2. If the control signal $S_{c4}$ is not equal to the predetermined value P1, or if the control signal $S_{c5}$ is not equal to the predetermined value P1, the calibration circuit 130 outputs the calibration signal $S_{cal}$ to turn on the second path and turn off the first path, and outputs the corresponding charging signal $S_{up2}$ and the discharging signal $S_{dn2}$. As a result, the ramp generator circuit 110 adjusts the duty cycle of the ramp signal $S_{ramp}$ according to the calibration signal $S_{cal}$, the charging signal $S_{up2}$, and the discharging signal $S_{dn2}$. Operations regarding herein will be provided with reference to FIG. 4C.

In some embodiments, the counter circuit 421 may count the pulses in the clock signal CLK only according to the charging signal $S_{up0}$ to generate the control signal $S_{c4}$, and the calibration circuit 130 may compare the control signal $S_{c4}$ with the predetermined value P1 to output the corresponding calibration signal $S_{cal}$ and the charging signal $S_{up2}$. In some embodiments, the counter circuit 421 may count the pulses in the clock signal CLK only according to the discharging signal $S_{dn0}$ to generate the control signal $S_{c5}$, and the calibration circuit 130 may compare the control signal $S_{c5}$ with the predetermined value P2 to output the corresponding calibration signal $S_{cal}$ and the discharging signal $S_{dn2}$. In other words, in different embodiments, the at least one pulse signal $S_p$ may include at least one of the charging signal $S_{up0}$ or the discharging signal $S_{dn0}$. The counter circuit 421 may count the clock signal CLK according to the at least one pulse signal $S_p$ to generate the at least one control signal $S_c$ (e.g., at least one of the control signal $S_{c4}$ or the control signal $S_{c5}$). The calibration circuit 130 may compare the at least one control signal $S_c$ with at least one predetermined value (e.g., at least one of the predetermined value P1 or the predetermined value P2), in order to generate at least one of the charging signal $S_{up2}$ or the discharging signal $S_{dn2}$. The arrangements of FIG. 4A are given for illustrative purposes, and the present disclosure is not limited thereto.

Figure 4B:
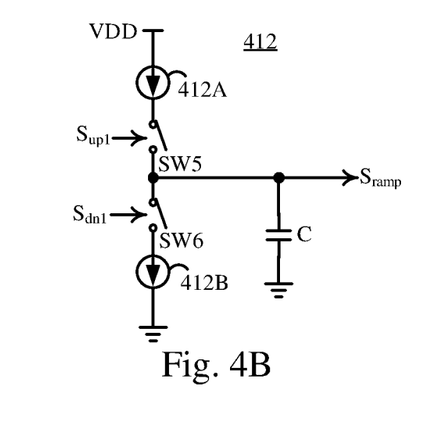
FIG. 4B is a schematic diagram of the signal generator circuit in FIG. 4A according to some embodiments of the present disclosure.
Figure 4C:
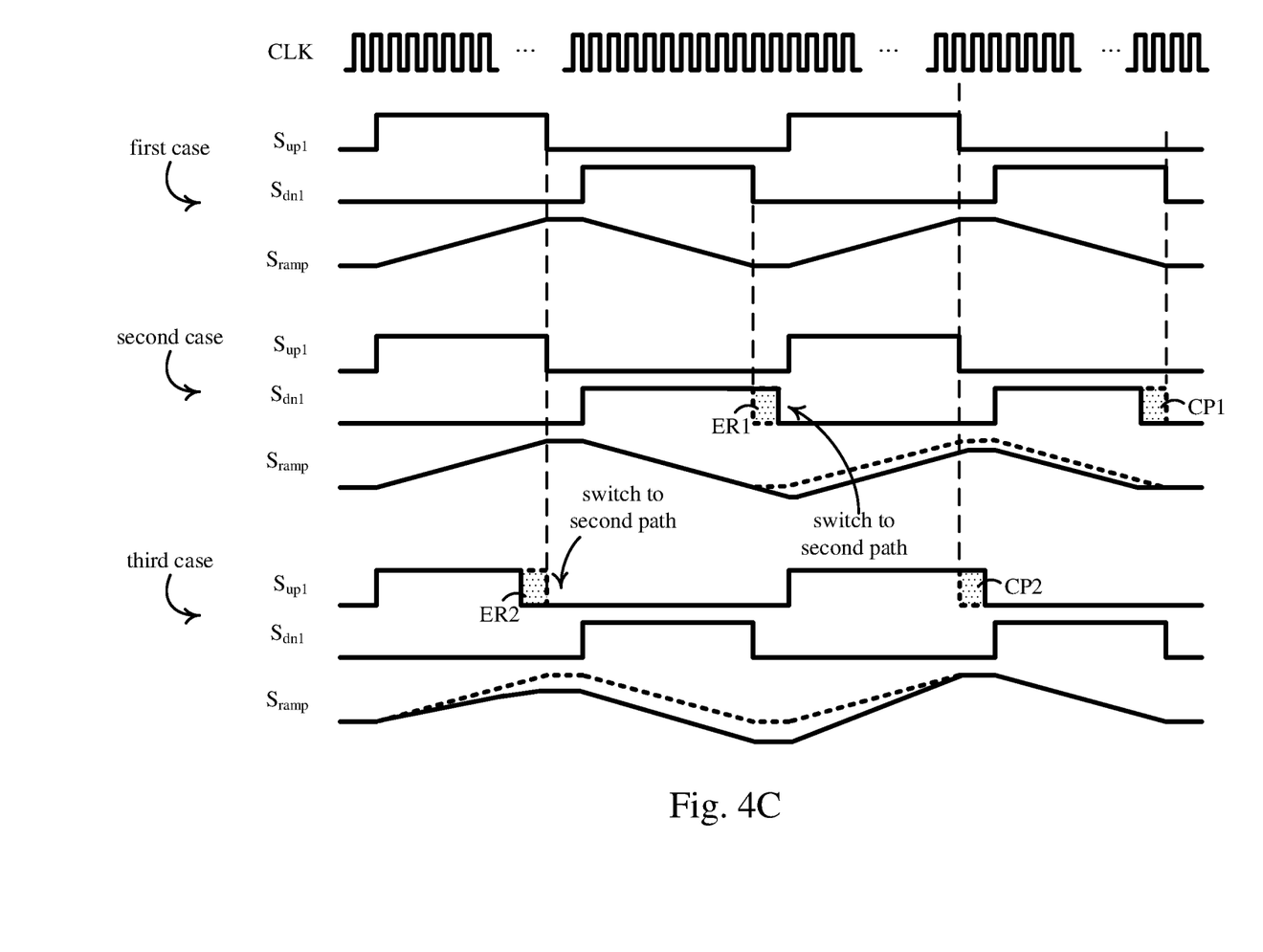
FIG. 4C is a waveform diagram of relevant signals in FIG. 4A according to some embodiments of the present disclosure.

FIG. 4B is a schematic diagram of the signal generator circuit 412 in FIG. 4A according to some embodiments of the present disclosure. The signal generator circuit 412 includes a current source circuit 412A, a current source circuit 412B, a switch SW5, a switch SW6, and a capacitor C. A first terminal of the current source circuit 412A receives the voltage VDD. The switch SW5 is coupled between a second terminal of the current source circuit 412A and the switch SW6. The current source circuit 412B is coupled between the switch SW6 and ground. A first terminal of the capacitor C is coupled to the switch SW5 and the switch SW6, and is configured to output the ramp signal $S_{ramp}$. A second terminal of the capacitor C is coupled to ground. When the switch SW5 is turned on in response to the charging signal $S_{up1}$, the current source circuit 412A charges the capacitor C. As a result, the capacitor C outputs the ramp signal $S_{ramp}$ having a positive slope. Alternatively, when the switch SW6 is turned on in response to the discharging signal $S_{dn1}$, the capacitor C is discharged via the current source circuit 412B. As a result, the capacitor C may output the ramp signal $S_{ramp}$ having a negative slope.

The arrangements of the ramp generator circuit 110 and the signal generator circuit 412 are given for illustrative purposes, and the present disclosure is not limited thereto. Various types of the ramp generator circuit 110 and the signal generator circuit 412 are within the contemplated scope of the present disclosure.

FIG. 4C is a waveform diagram of relevant signals in FIG. 4A according to some embodiments of the present disclosure. The counter circuit 421 counts the pluses in the clock signal CLK according to the duty cycle of the charging signal $S_{up0}$ (e.g., an intervals where the charging signal $S_{up0}$ having a high level) to generate the control signal $S_{c4}$, in which the value of the control signal $S_{c4}$ indicates a number of pulses corresponding to the duty cycle. Similarly, the counter circuit 421 counts the pulses in the clock signal CLK according to the duty cycle of the discharging signal $S_{dn0}$ to generate the control signal $S_{c5}$, in which the value of the control signal $S_{c5}$ indicates the number of pulses corresponding to the duty cycle.

During an initial phase, the first path is turned on and the second path is turned off. Under this condition, the charging signal $S_{up0}$ is outputted to be the charging signal $S_{up1}$, and the discharging signal $S_{dn0}$ is outputted to be the discharging signal $S_{dn1}$. In a first case, the calibration circuit 130 determines that the control signal $S_{c4}$ is equal to the predetermined value P1 and that the control signal $S_{c5}$ is equal to the predetermined value P2. Under this condition, the calibration circuit 130 does not change the calibration signal $S_{cal}$ in order to keep the first path being turned on. As a result, the control circuit 411 may continuously output the charging signal $S_{up0}$ to be the charging signal $S_{up1}$, and continuously output the discharging signal $S_{dn0}$ to be the discharging signal $S_{dn1}$.

Compared with the first case, in a second case, an error ER1 occurs in the discharging signal $S_{dn1}$, such that the duty cycle of the discharging signal $S_{dn1}$ is increased mistakenly. As a result, compared with an ideal waveform (shown with dotted lines), the level of the ramp signal $S_{ramp}$ is lower. Under this condition, the number of pulses corresponding to such duty cycle will be increased, and thus the counter circuit 421 outputs the control signal $S_{c5}$ having a higher value. The calibration circuit 130 determines that the control signal $S_{c5}$ is higher than the predetermined value P2 and outputs the corresponding calibration signal $S_{cal}$ to turn off the first path and turn of the second path, in order to transmit the discharging signal $S_{dn2}$ to be the discharging signal $S_{dn1}$ via the second path. As shown in FIG. 4C, the duty cycle of the calibrated discharging signal $S_{dn1}$ is reduced by a compensation amount CP1. As a result, the discharging time of the capacitor C in FIG. 4B is shortened to restore the ramp signal $S_{ramp}$ to the predetermined level.

Compared with the first case, in a third case, an error ER2 occurs in the charging signal $S_{up1}$, such that the duty cycle of the charging signal $S_{up1}$ is shortened mistakenly. As a result, compared with the idea waveform (shown with dotted lines), the level of the ramp signal $S_{ramp}$ is lower. Under this condition, the number of pulses corresponding to the duty cycle of the charging signal $S_{up1}$ will be reduced, and thus the counter circuit 421 outputs the control signal $S_{c4}$ having a lower value. The calibration circuit 130 determines that the control signal $S_{c5}$ is higher than the predetermined value P2, and outputs the corresponding calibration signal $S_{cal}$ to turn off the first path and turn on the second path, in order to transmit the charging signal $S_{up2}$ to be the charging signal $S_{up1}$. As a shown in FIG. 4C, the duty cycle of the calibrated charging signal $S_{up1}$ is increased by a compensation amount CP2. As a result, the charging time of the capacitor C in FIG. 4B is increased to restore the ramp signal $S_{ramp}$ to the ideal level.

The above cases are for illustrating operations about various circuits, but the present disclosure is not limited thereto. For example, similar to the second case, if the duty cycle of the charging signal $S_{up1}$ is increased mistakenly, the duty cycle of the calibrated charging signal $S_{up1}$ Will be shortened. Alternatively, similar to the third case, if the duty cycle of the discharging signal $S_{dn1}$ is shortened mistakenly, the duty cycle of the calibrated discharging signal $S_{dn1}$ will be increased.

As described above, the ramp signal calibration device in some embodiments can utilize a variety of ways to calibrate a ramp signal without resetting the ramp signal. As a result, a lower availability of the ramp signal can be avoided.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A ramp signal calibration device, comprising:
a ramp generator circuit configured to output a ramp signal according to a set signal and a calibration signal;
a detector circuitry configured to detect the ramp signal or at least one pulse signal associated with the ramp signal, in order to generate at least one control signal; and
a calibration circuit configured to receive the at least one control signal and generate the calibration signal in response to the received at least one control signal, in order to adjust at least one of a falling slope or a rising slope of the ramp signal, wherein the detector circuitry is configured to detect the ramp signal at a time point defined by a corresponding edge of a falling edge and a rising edge of the ramp signal.

2. The ramp signal calibration device of claim 1, wherein the detector circuitry comprises:
a first comparator circuit configured to compare the ramp signal with a first reference voltage in response to the corresponding edge of the falling edge and the rising edge of the ramp signal, in order to generate a first control signal of the at least one control signal; and
a second comparator circuit configured to compare the ramp signal with a second reference voltage in response to the corresponding edge, in order to generate a second control signal of the at least one control signal, wherein the first reference voltage is higher than the second reference voltage.

3. The ramp signal calibration device of claim 2, wherein if the corresponding edge is the falling edge and if the second reference voltage is higher than the ramp signal, the ramp generator circuit is further configured to decrease an absolute value of a slope of a next falling edge of the ramp signal according to the calibration signal.

4. The ramp signal calibration device of claim 2, wherein if the corresponding edge is the falling edge and if the ramp signal is higher than the first reference voltage, the ramp generator circuit is further configured to increase an absolute value of a slope of a next falling edge of the ramp signal according to the calibration.

5. The ramp signal calibration device of claim 2, wherein if the corresponding edge is the rising edge and if the second reference voltage is higher than the ramp signal, the ramp generator circuit is further configured to increase a slope of a next rising edge of the ramp signal according to the calibration signal.

6. The ramp signal calibration device of claim 2, wherein if the corresponding edge is the rising edge and if the ramp signal is higher than the first reference voltage, the ramp generator circuit is further configured to decrease a slope of a next rising edge of the ramp signal according to the calibration signal.

7. The ramp signal calibration device of claim 1, wherein the detector circuitry comprises:

a first comparator circuit configured to compare the ramp signal with a first reference voltage in response to the rising edge of the ramp signal, in order to generate a first control signal of the at least one control signal; and
a second comparator circuit configured to compare the ramp signal with a second reference voltage in response to the falling edge of the ramp signal, in order to generate a second control signal of the at least one control signal, wherein the first reference voltage is higher than the second reference voltage.

8. The ramp signal calibration device of claim 7, wherein if the second reference voltage is higher than the ramp signal, the ramp generator circuit is further configured to decrease an absolute value of a slope of a next falling edge of the ramp signal according to the calibration signal.

9. The ramp signal calibration device of claim 7, wherein if the ramp signal is higher than the first reference voltage, the ramp generator circuit is further configured to decrease a slope of a next rising edge of the ramp signal according to the calibration signal.

10. The ramp signal calibration device of claim 1, wherein the calibration circuit does not reset the ramp signal.

11. The ramp signal calibration device of claim 1, wherein the calibration circuit is configured to directly receive the at least one control signal.

12. A ramp signal calibration device, comprising:
a ramp generator circuit configured to output a ramp signal according to a set signal and a calibration signal;
a detector circuitry configured to detect the ramp signal or at least one pulse signal associated with the ramp signal, in order to generate at least one control signal; and
a calibration circuit configured to receive the at least one control signal and generate the calibration signal in response to the received at least one control signal, in order to adjust at least one of a falling slope or a rising slope of the ramp signal,
wherein the detector circuitry comprises:
a first comparator circuit configured to compare the ramp signal with a first reference voltage in response to a corresponding edge of a falling edge and a rising edge of the ramp signal, in order to generate a first control signal of the at least one control signal; and
a second comparator circuit configured to compare the ramp signal with a second reference voltage in response to the corresponding edge, in order to generate a second control signal of the at least one control signal,
wherein the first reference voltage is higher than the second reference voltage, the first comparator circuit is configured to compare the ramp signal with the first reference voltage at a time point defined by the corresponding edge, and the second comparator circuit is configured to compare the ramp signal with the second reference voltage at the time point defined by the corresponding edge.

* * * * *